United States Patent
Lee et al.

(10) Patent No.: US 7,944,293 B2
(45) Date of Patent: May 17, 2011

(54) SYSTEMS AND METHODS FOR AN ADAPTIVE BIAS CIRCUIT FOR A DIFFERENTIAL POWER AMPLIFIER

(75) Inventors: Dong Ho Lee, Cedar Rapids, IA (US); Kyu Hwan An, Dunwoody, GA (US); Jeonghu Han, Atlanta, GA (US); Chang-Ho Lee, Marietta, GA (US); Joy Laskar, Marietta, GA (US)

(73) Assignees: Samsung Electro-Mechanics Company, Ltd. (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/620,462

(22) Filed: Nov. 17, 2009

(65) Prior Publication Data
US 2010/0148871 A1    Jun. 17, 2010

Related U.S. Application Data (60) Provisional application No. 61/121,798, filed on Dec. 11, 2008.

(51) Int. Cl.
*H03F 3/68* (2006.01)
(52) U.S. Cl. .................................. 330/124 R; 330/295
(58) Field of Classification Search .............. 330/124 R, 330/295, 84, 126
See application file for complete search history.

(56) References Cited

U.S. PATENT DOCUMENTS

| | | | |
|---|---|---|---|
| 5,712,593 A | | 1/1998 | Buer |
| 5,757,229 A | * | 5/1998 | Mitzlaff ..................... 330/124 R |
| 6,114,911 A | * | 9/2000 | Iwai et al. .................... 330/295 |
| 6,300,837 B1 | | 10/2001 | Sowlati et al. |
| 6,496,063 B2 | | 12/2002 | Hinrichsen et al. |
| 6,556,084 B2 | | 4/2003 | Sowlati |
| 6,639,465 B2 | | 10/2003 | Samelis et al. |
| 6,714,071 B1 | | 3/2004 | Page |
| 6,756,844 B2 | | 6/2004 | Nanao et al. |
| 6,791,418 B2 | | 9/2004 | Luo et al. |
| 6,819,180 B2 | | 11/2004 | Krvavac |
| 6,882,227 B2 | | 4/2005 | Barry et al. |
| 7,005,923 B2 | | 2/2006 | Noh et al. |
| 7,274,258 B2 | | 9/2007 | Wang |
| 7,352,247 B2 | | 4/2008 | Oh et al. |
| 7,605,648 B2 | * | 10/2009 | Yamamoto et al. ............. 330/51 |

FOREIGN PATENT DOCUMENTS

| | | |
|---|---|---|
| KR | 2004-22454 A | 3/2004 |
| WO | 03/010885 A1 | 2/2003 |

OTHER PUBLICATIONS

Office Action for Korean Patent Application No. 10-2009-0123319 issued on Feb. 16, 2011.

\* cited by examiner

*Primary Examiner* — Henry K Choe
(74) *Attorney, Agent, or Firm* — Sutherland Asbill & Brennan LLP (57) ABSTRACT

Systems and methods for providing an adaptive bias circuit that may include a differential amplifier, low-pass filter, and common source amplifier or common emitter amplifier. The adaptive bias circuit may generate an adaptive bias output signal depending on input signal power level. As the input power level goes up, the adaptive bias circuit may increase the bias voltage or bias current of the adaptive bias output signal. A power amplifier (e.g., a differential amplifier) may be biased according to the adaptive bias output signal in order to reduce current consumption at low power operation levels.

9 Claims, 8 Drawing Sheets

SYSTEMS AND METHODS FOR AN ADAPTIVE BIAS CIRCUIT FOR A DIFFERENTIAL POWER AMPLIFIER

RELATED APPLICATION

This application claims priority to U.S. Provisional Application No. 61/121,798, filed on Dec. 11, 2008, and entitled "SYSTEMS AND METHODS FOR AN ADAPTIVE BIAS CIRCUIT FOR A DIFFERENTIAL POWER AMPLIFIER", which is hereby incorporated by reference in its entirety as if fully set forth herein.

FIELD OF INVENTION

The invention relates generally to power amplifiers, and more particularly, to systems and methods for adaptive bias circuits for differential power amplifiers.

BACKGROUND OF THE INVENTION

An amplifier typically has low efficiency and large linearity margins at low power regions, and high efficiency and small linearity margins at high power regions. For linear amplifiers, the linearity is limited at the highest output power condition, which is known as the saturated region. The linearity and efficiency of an amplifier may be affected by the bias conditions of the amplifier. Adaptive biasing generates an appropriate bias to enhance the performance of power amplifiers with respect to their input and/or output power levels.

Amplifiers may be classified depending on their associated bias level and current conduction angle. These classifications include class-A, class-B, class-AB, and class-C amplifiers. For instance, a class-A amplifier has the highest bias level with the highest linearity, and class-C has the lowest bias level with the lowest linearity. In contrast, class-A amplifiers have the lowest efficiency, and class-C amplifiers have the highest efficiency. This is because typically the efficiency of an amplifier has than opposite reaction to bias conditions than that of an amplifier's linearity.

However, if the bias of the amplifier is controlled adaptively, it can achieve better performance compared to an amplifier with fixed bias conditions. For instance, if the amplifier is biased near class-B at a low power region and class-A at a high power region, it can achieve better efficiency at the low power region and better linearity at the high power region while still meeting acceptable linearity specifications at the low power region and acceptable efficiency specifications at the high power region.

Figure 1:
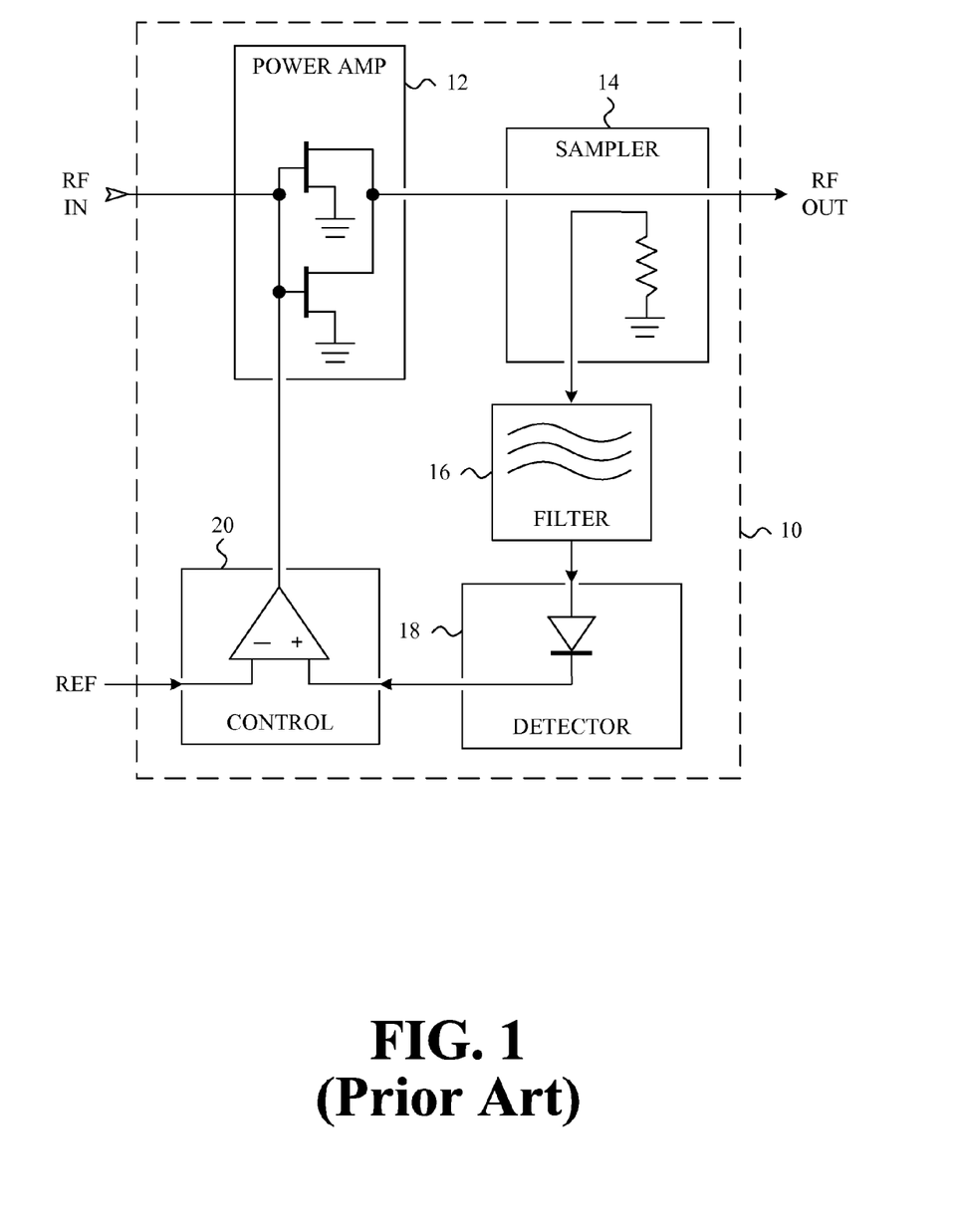
FIG. 1 is a schematic diagram for a power amplifier with a conventional adaptive bias circuit.

Fundamental configurations of most conventional adaptive biasing schemes for power amplifiers are composed of a power detector component, a low-pass filter, and a bias voltage or current generating component. FIG. 1 shows a schematic diagram for a conventional power amplifier with a conventional adaptive bias circuit providing a feedback signal. A power amplifier with a feedback signal has a highly efficient linear performance. For the power amplifier 12 shown in FIG. 1, an output signal is sampled by an output sampler 14, and the sampled signal is then filtered by a filter 16. The filtered signal power is detected by a detector 18, and the detected signal is controlled by a control circuit 20. This controlled signal re-biases the power amplifier 12. The control circuit 20 adjusts the power amplifier 12 to maximize efficiency with an allowable distortion.

Figure 2:
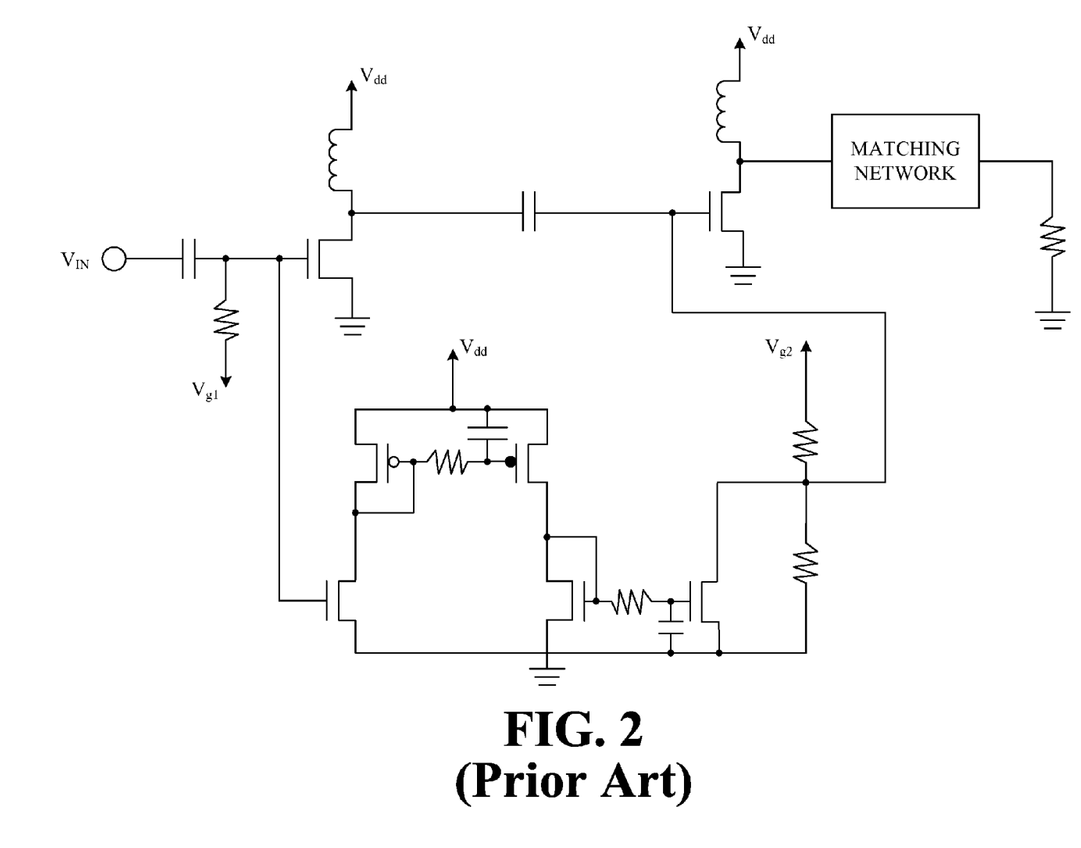
FIG. 2 is another schematic diagram for a power amplifier with a conventional adaptive bias circuit.

Another schematic diagram for a power amplifier with a conventional adaptive bias circuit is shown in FIG. 2. FIG. 2 shows a class C amplifier that has linearized with dynamic biasing. The bias circuit includes a sampling stage, two current mirrors with RF filters, and a resistive divider to provide dynamic biasing. This configuration shown in FIG. 2 makes a class C amplifier work like a class B amplifier, but with increased efficiency.

BRIEF SUMMARY OF THE INVENTION

Example embodiments of the invention may provide for an adaptive bias circuit, which may include a differential amplifier, low-pass filter, and a common source amplifier if a field-effect transistor (FET) is utilized (or alternatively, a common emitter amplifier if a bipolar junction transistor (BJT) is utilized). In an example embodiment of the invention, the adaptive bias circuit may generate an adaptive bias output signal depending on an input signal power level. As input power level goes up, the adaptive bias circuit increases the bias voltage or bias current of the adaptive bias output signal. The adaptive bias output signal may be a gate bias voltage if received by a gate of a FET or otherwise a base current if received by a base of a BJT.

According to an example embodiment of the invention, there is an adaptive bias circuit for controlling an operations of an amplifier. The adaptive bias circuit may include a differential amplifier that receives differential input signals and generates amplified differential input signals; a current mirror that converts the amplified differential input signals into a single-ended signal; a low-pass filter that filters out one or more high-frequency components of the single-ended signal to generate a filtered single-ended signal; and a common-source amplifier or common-emitter amplifier that receives the filtered single-ended signal and generates an adaptive bias signal for operating a power amplifier.

According to another example embodiment of the invention, there is a power amplification system. The system may include a plurality of power amplifiers configured in parallel, where the plurality of power amplifiers receive at least one common input signal, where each of the plurality of power amplifiers generates a respective at least one amplified output signal, where respective at least one amplified output signal are combined to provide at least one combined amplified signal; and a plurality of adaptive bias circuits corresponding to each of the plurality of power amplifiers for providing a respective adaptive bias signal to the respective power amplifier, where at least two of the plurality of adaptive bias circuits have differing bias ranges for the provided respective adaptive bias signals. Each of at least two of the plurality of adaptive bias circuits may include a differential amplifier that receives differential input signals and generates amplified differential input signals; a current mirror that converts the amplified differential input signals to generate a single-ended signal; a low-pass filter that filters out one or more high-frequency components of the single-ended signal to generate a filtered single-ended signal; and a common-source amplifier or common-emitter amplifier that receives the filtered single-ended signal and generates the respective adaptive bias signal for operating the respective power amplifier.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may be directed to systems and methods for providing an adaptive bias circuit that may include one or more of a differential amplifier, a low-pass filter, and a common source amplifier if a field-effect transistor (FET) is utilized (or alternatively, a common emitter amplifier if a bipolar junction transistor (BJT) is utilized). The adaptive bias circuit may generate an adaptive bias output signal (e.g., a gate bias voltage if received by a gate of a FET or base current if received by a base of a BJT) depending on input signal power level. As the input power level goes up, the adaptive bias circuit may increase the bias voltage or bias current of the adaptive bias output signal. Thus, a power amplifier (e.g., a differential amplifier) may be biased according to the adaptive bias output signal may be able to reduce current consumption at low power operation levels. In this way, the use of the adaptive bias circuit with a power amplifier may enable the power amplifier to achieve better linearity at high power operation levels compared to conventional biasing techniques, according to an example embodiment of the invention.

While example embodiments of the invention are illustrated with respect to FETs (e.g., MOSFETs), it should be appreciated that BJTs may equally be utilized instead of FETs. As an example, FETs may have respective gates, sources, and drains while BJTs may have respective bases, emitters, and collectors. Thus, any gate, source, or drain of a FET discussed herein could likewise be substituted with a corresponding base, emitter, or collector of a BJT without departing from example embodiments of the invention.

Figure 3:
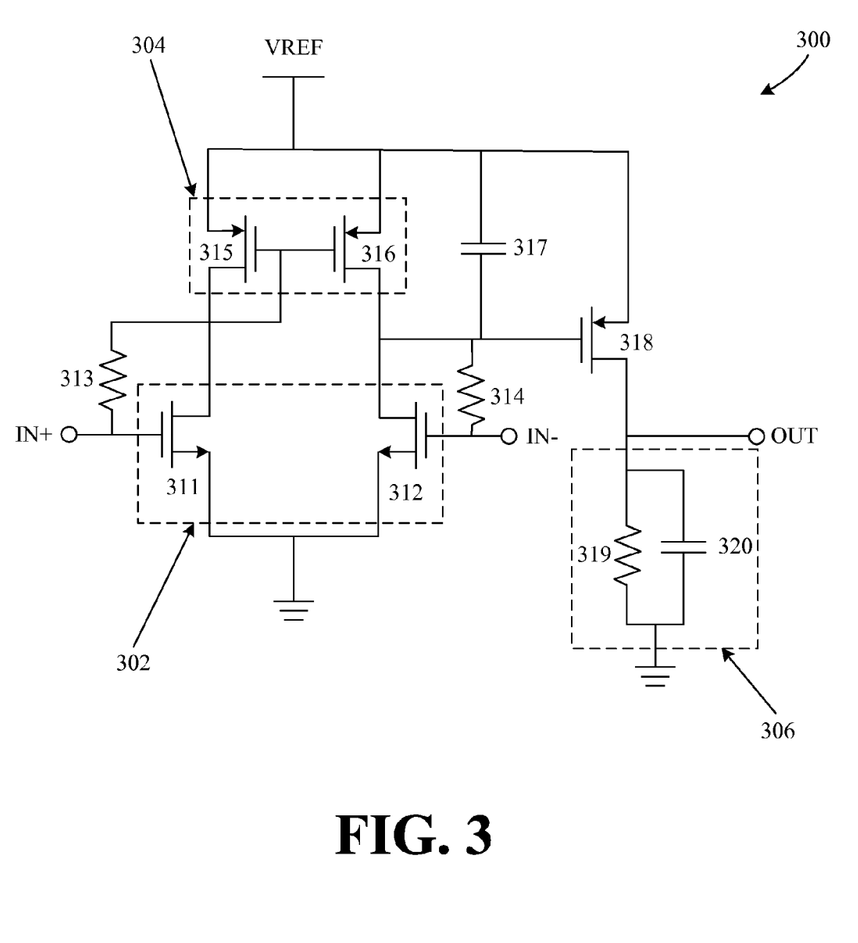
FIG. 3 illustrates an example adaptive bias circuit in accordance with an example embodiment of the invention.

FIG. 3 illustrates a schematic diagram of an example adaptive bias circuit 300, according to an example embodiment of the invention. As shown in the example embodiment of FIG. 3, the example adaptive bias circuit 300 may include a differential amplifier 302, an active current mirror 304, a low-pass filter that includes capacitor 317, a common source amplifier (or alternatively, a common emitter amplifier) that includes transistor 318, and an RC parallel load 306.

The differential amplifier 302 may include transistors 311 and 312. As illustrated, the transistors 311, 312 may be metal-oxide-semiconductor field-effect transistors (MOSFETs), and more particularly, N-channel MOSFETs. The transistors 311, 312 may include respective gates, sources, and drains for MOSFETs. The active current mirror 304 may include transistors 315 and 316. As illustrated, the transistors 315, 316 may be MOSFETs, and more particularly P-channel MOSFETs. The transistors 315, 316 may include respective gates, sources, and drains for respective MOSFETs. Similarly, the transistor 318 of the common source amplifier may be a MOSFET, and more particularly, a P-channel MOSFET. Accordingly, the transistor 318 may include a gate, source, and drain. It will be appreciated that one or more of the transistors 311, 312, 315, 316, 318 in FIG. 3 may be bipolar junction transistors (BJTs) instead of MOSFETs without departing from example embodiments of the invention. If a BJT is utilized instead of a MOSFET, then the BJT will include a base, emitter, and collector instead of a gate, source, and drain, as appreciated by those of ordinary skill in the art. For example, the common source amplifier described herein that utilizes a MOSFET can be replaced with a common emitter amplifier that utilizes a BJT without departing from example embodiments of the invention.

During operation, the differential amplifier 302 amplifies differential input signals IN+, IN− to generate an amplified differential input signal. To do so, the differential amplifier 302 is configured such that the gate of the transistor 311 receives the non-inverted differential input signal IN+ while the gate of the transistor 312 receives the inverted differential input signal IN−. The differential inputs signals IN+, IN− generally have substantially equivalent magnitudes but opposite phases, according to an example embodiment of the invention. It will be appreciated that in accordance with an example embodiment of the invention, the differential input signals IN+, IN− may be received from one or more of the following nodes: i) differential inputs of a differential power amplifier (ii) differential outputs of a differential power amplifier (iii) differential inputs of previous or next stage differential power amplifier (iv) differential outputs of previous or next stage differential power amplifier.

Still referring to FIG. 3, the source of transistor 311 may be electrically connected to the source of transistor 312, and both sources may be connected to ground (GND). The differential amplifier 302 may also be self-biased using biasing resistors 313, 314. In particular, a biasing resistor 313 may be connected across the gate and drain of the transistor 311. Similarly, a biasing resistor 314 may be connected across the gate an drain of the transistor 312.

The amplified differential signals generated by the differential amplifier 302 may be received by the active current mirror 304. The active current mirror 304 may be operative to convert the amplified differential signals from the differential amplifier 302 into a single-ended signal. More specifically, the amplified differential signals may be provided to the active current mirror 304 by connecting the drain of transistor 311 to the drain of transistor 315, and by connecting the drain of transistor 312 to the drain of transistor 316. The gate of transistor 315 may be connected to the gate of transistor 316. In addition, the gate of transistor 315 may further be connected or shorted to the drain of transistor 315 such that transistor 315 may be referred to as a diode-connected transistor. It will be appreciated that a diode may alternatively be utilized in place of a diode-connected transistor, according to an example embodiment of the invention. The sources of transistors 315, 316 may be connected to a maximum voltage source VREF.

The single-ended signal generated by the active current mirror 304 may be filtered by a low-pass filter that includes capacitor 317, and the filtered single-ended signal may be provided to the common source amplifier (or alternatively, common emitter amplifier) that includes transistor 318. The low-pass filter that includes the capacitor 317 may be connected in parallel with active current mirror 304. In particular, a first end of the capacitor 317 may be connected to the sources of transistors 315, 316, which are commonly connected to voltage source VREF and the source of transistor 318. Likewise, a second end of the capacitor 317 may be connected to the drains of the transistors 316, 312, which are commonly connected to the second end of biasing resistor 314 and the gate of transistor 318. The capacitor 317 may be used by the low-pass filter to remove one or more high frequency components (e.g., carrier frequency signal from IN+ and IN−) of the single-ended signal generated by the active current mirror 304.

Upon receiving the filtered single-ended signal at the gate of the transistor 318, the common source amplifier (or alternatively, common emitter amplifier) comprising transistor 318 may generate an adaptive bias output signal OUT based upon the gate bias of transistor 318. The adaptive bias output signal OUT may be provided at the drain of transistor 318, which is likewise connected to a RC parallel load 306. The RC parallel load 306 may comprise a resistor 319 in parallel with a capacitor 320, which may be operative as a low-pass filter load. The RC parallel load 306 may be provided as the load of the common source amplifier (or alternatively, the common emitter amplifier) in order to filter out the high frequency components adaptive bias output signal OUT, according to an example embodiment of the invention. It will that adaptive bias output signal OUT may be a gate bias voltage if received by a gate of a FET or otherwise a base current if received by a base of a BJT.

Still referring to the example adaptive bias circuit 300 of FIG. 3, the initial bias points of transistors 311, 312, 315, 316, and 318 may be determined by their respective gate (or base) lengths and respective gate (or base) widths, and voltage source VREF may define the maximum voltage for the adaptive bias output signal OUT, according to an example embodiment of the invention. The initial output voltage (or current) for the output signal OUT may be based upon the selection of transistor 318 and load resistor 319. The output voltage for the adaptive bias output signal OUT at saturation region of transistor 318 may be close to the maximum voltage defined by voltage source VREF.

In an example embodiment of the invention, the adaptive bias circuit 300 may generate adaptive bias (for output signal OUT) from the initial output voltage to VREF as the input differential signals IN+, IN− increases. As the input differential signals IN+, IN− increase, the average current through the differential amplifier 302 (comprising transistors 311 and 312) may increase. As a result, the drain voltages of transistors 311 and 312 may go down, and high frequency components may be filtered out by the low-pass filter comprising capacitor 317. As the gate voltage of transistor 318 goes down, the current through transistor 318 may increase and thus, the output voltage of the adaptive bias output signal OUT may increase.

Figure 4:
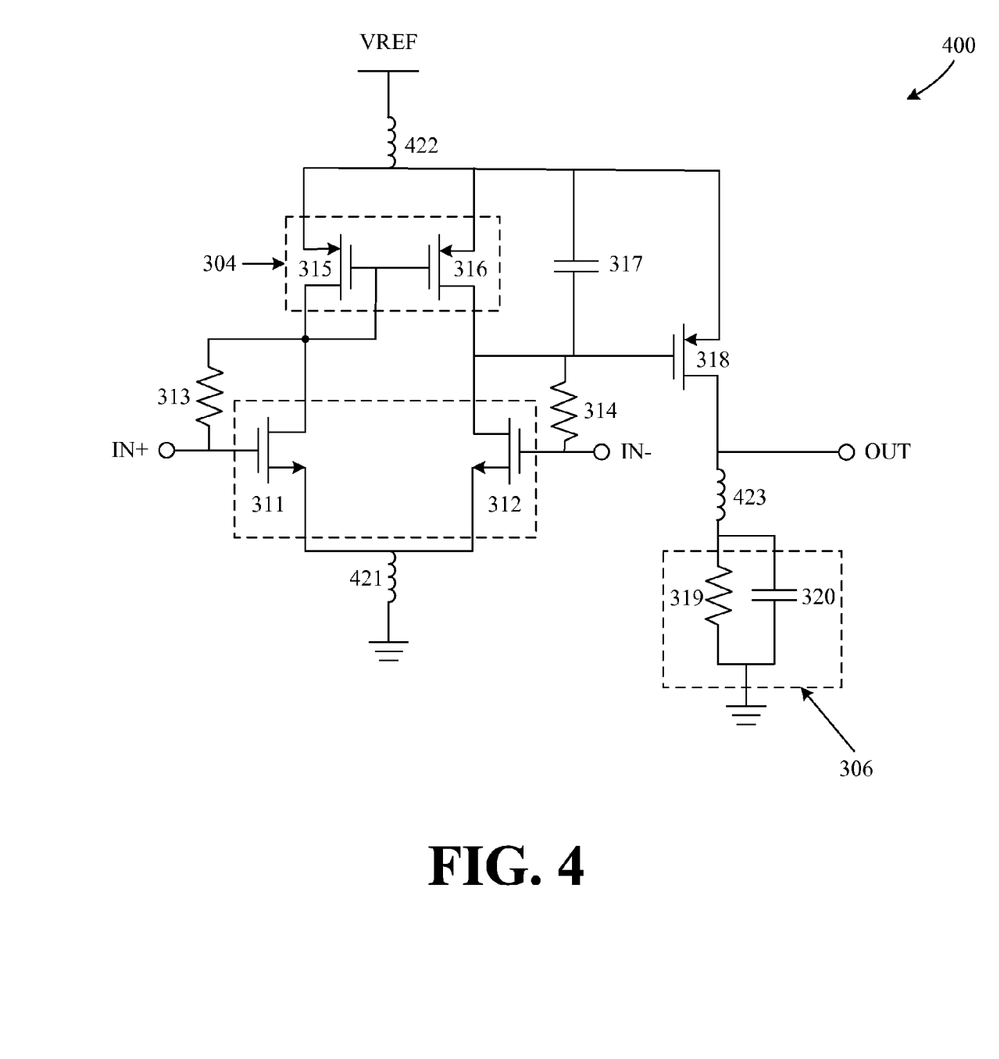
FIG. 4 illustrates another example adaptive bias circuit in accordance with an example embodiment of the invention.

FIG. 4 illustrates a variation of the example adaptive bias circuit of FIG. 3, according to an example embodiment of the invention. In particular, the example adaptive bias circuit 400 of FIG. 4 may be similar to the example bias circuit 300 of FIG. 3, except for the illustrative specification of bonding wires 421, 422, and 423. The bonding wires 421, 422, 423 may be provided for packaging. As an example, all of the components of the adaptive bias circuit 400 except for ground (GND), voltage source VREF, and the RC parallel load 306 may be packaged together, perhaps in a single chip. The bonding wire 421 may then be used connect the sources of transistors 311, 312 to an external ground (GND). Likewise, the bonding wire 422 may be used to connect the sources of transistors 315, 316, the first end of capacitor 317, and the source of transistor 318 to an external voltage source VREF. Similarly, the bonding wire 423 may be used to connect the drain of transistor 318 to an external RC parallel load 306. In example embodiment of the invention, the RC parallel load 306 may be implemented with off-chip components for tuning. It will be appreciated that bonding wires 421, 422, 423 may comprise not only wires, according to an example embodiment of the invention. For example, bonding wires 421, 422, 423 may also include transmission lines, bonding pads, or solder bumps or balls, or other connection means according to example embodiment of the invention.

Figure 5:
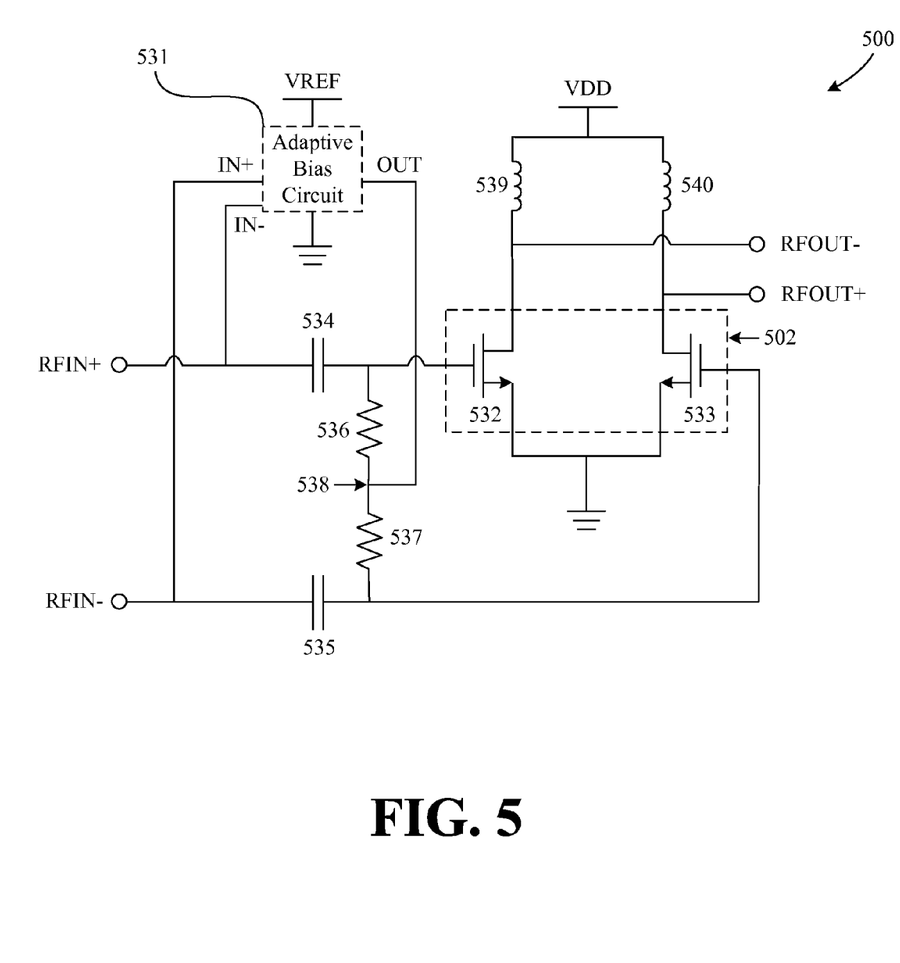
FIG. 5 illustrates an example amplifier with an adaptive bias circuit in accordance with an example embodiment of the invention.

FIG. 5 illustrates a schematic diagram of an example differential amplifier with an adaptive bias circuit, where the inputs and output of the adaptive bias circuit are connected to inputs of the example differential amplifier, in accordance with an example embodiment of the invention. As shown in the example embodiment of FIG. 5, the example amplifier with an adaptive bias circuit may include a differential amplifier 502 including transistors 532 and 533, an adaptive bias circuit 531, biasing resistors or choke inductors 536 and 537, and input DC block capacitors 534 and 535.

As configured, the differential amplifier 502 may include transistors 532 and 533, which each may be a MOSFET, and in particular an N-channel MOSFET, according to an example embodiment of the invention. It will be appreciated, however, that BJTs or FETs may be utilized instead of MOSFETs without departing from example embodiments of the invention. Each transistor 532, 533 may include a respective gate, source, and drain. The source of the transistor 532 may be connected to the source of transistor 533, and both sources may be connected to ground (GND). The drains of transistors 532, 533 may be connected to a voltage source VDD via respective bonding wires 539, 540. In the example embodiment, the differential amplifier 502 may amplify input differential signals RFIN+ and RFIN−, which are generally received by the differential amplifier 502 through respective gates of transistors 532, 533. The differential amplifier 502 may provide the amplified differential output signals RFOUT−, RFOUT+ via respective drains of the transistors 532, 533.

It will be appreciated that adaptive bias circuit 531 of FIG. 5 may implemented as one of the adaptive bias circuits 300, 400 of FIG. 3 or 4, respectively, or a variation thereof. As shown in FIG. 5, the adaptive bias circuit 531 may receive input differential signals RFIN+, RFIN− as the respective inputs IN+, IN− of the adaptive bias circuit 531. The adaptive bias circuit 531 may then generate an adaptive bias output signal OUT for inputs (e.g., a voltage bias signal if received by a gate of a FET or a current bias signal if received by a base of a BJT) of transistors 532 and 533 of the differential amplifier 502. To do so, the adaptive bias circuit 531 may detect the power of differential input signals RFIN+ and RFIN− in front of the input DC block capacitors 534, 535 and may feed the generated adaptive bias output signal OUT to the virtual ground 538 of the differential amplifier inputs through the biasing resistors (or choke inductors) 536 and 537. The virtual ground 538 receiving the generated output signal OUT may be connected to respective first ends of biasing resistors (or choke inductors) 536 and 538. The second end of biasing resistor (or choke inductor) 536 may be connected to the gate (or alternatively, base) of transistor 532 as well as to a first end of the capacitor 534. The second end of the capacitor 534 may be connected to the differential input signal RFIN+. Likewise, the second end of the biasing resistor 537 may be connected to the gate of transistor 533 as well as to a first end of the capacitor 535. A second end of the capacitor 535 may be connected to the differential input signal RFIN−.

It will be appreciated that the biasing resistors (or choke inductors) 536 and 537 may block the radio frequency (RF) input signals (RFIN+, RFIN−) and feed the adaptive bias output signal OUT from the adaptive bias circuit 531 through themselves. Moreover, the input DC block capacitors 534 and 535 may block the DC voltage of the adaptive bias circuit 531 input bias (e.g., from RFIN+ and RFIN−, the previous stage outputs).

Figure 6:
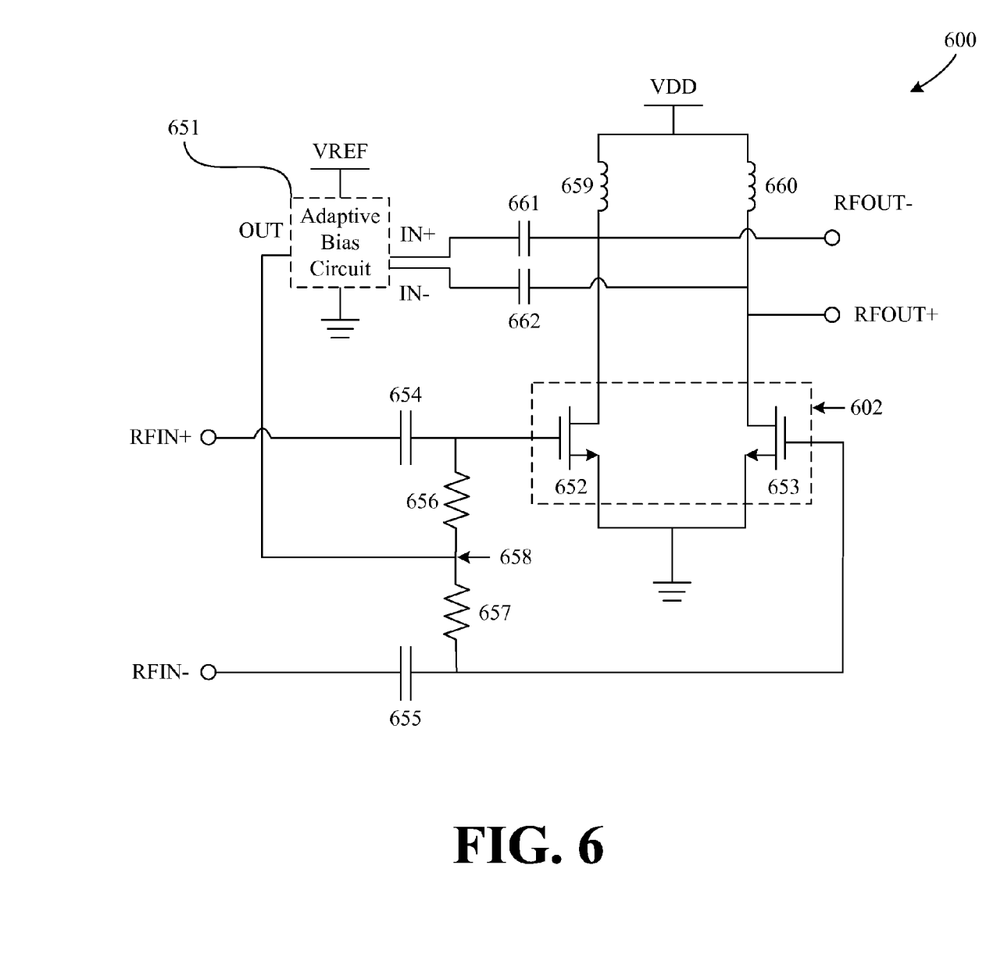
FIG. 6 illustrates another example amplifier with an adaptive bias circuit in accordance with an example embodiment of the invention.

FIG. 6 illustrates another schematic diagram of a differential amplifier with an adaptive bias circuit, where the inputs and outputs of the adaptive bias circuit are connected to outputs and inputs of the differential amplifier, respectively, in accordance with an example embodiment of the invention. As shown in the example embodiment of FIG. 6, the example amplifier with an adaptive bias circuit may include a differential amplifier 602 including transistors 652 and 653, an adaptive bias circuit 651, biasing resistors or choke inductors 656 and 657, and input DC block capacitors 654 and 655.

As configured, the differential amplifier 602 may include transistors 652 and 653, which each may be a MOSFET, and in particular an N-channel MOSFET, according to an example embodiment of the invention. It will be appreciated, however, that BJTs or other FETs may be utilized instead of MOSFETs without departing from example embodiments of the invention. Each transistor 652, 653 may include a respective gate, source, and drain. The source of the transistor 652 may be connected to the source of transistor 653, and both sources may be connected to ground (GND). The drains of transistors 652, 653 may be connected to a voltage source VDD via respective bonding wires 659, 660. In the example embodiment, the differential amplifier 602 may amplify input differential signals RFIN+ and RFIN−, which are generally received by the differential amplifier 602 through respective gates of transistors 652, 653. The differential amplifier 602 may provide the amplified differential output signals RFOUT−, RFOUT+ via respective drains of the transistors 652, 653.

It will be appreciated that adaptive bias circuit 651 of FIG. 6 may implemented as one of the adaptive bias circuits 300, 400 of FIG. 3 or 4, respectively. As shown in FIG. 6, the adaptive bias circuit 651 may receive differential output signals RFOUT+, RFOUT− following DC block capacitors 661, 662 as the respective inputs IN−, IN+ of the adaptive bias circuit 651. The adaptive bias circuit 651 may then generate an adaptive bias output signal OUT for inputs (e.g., a voltage bias signal if received by a gate of a FET or a current bias signal if received by a base of a BJT) of transistors 652 and 653 of the differential amplifier 602. To do so, the adaptive bias circuit 651 may detect the power of differential output signals RFOUT+ and RFOUT−, and may feeds the generated adaptive bias output signal OUT to the virtual ground 658 of the differential amplifier 602 inputs through the biasing resistors (or choke inductors) 656 and 657. More specifically, the virtual ground 658 receiving the generated output signal OUT may be connected to respective first ends of biasing resistors (or choke inductors) 656 and 658. The second end of biasing resistor (or choke inductor) 656 may be connected to the gate of transistor 652 as well as to a first end of the DC block capacitor 654. The second end of the DC block capacitor 654 may be connected to the differential input signal RFIN+. Likewise, the second end of the biasing resistor 657 may be connected to the gate (or alternatively, base) of transistor 653 as well as to a first end of the DC block capacitor 655. A second end of the DC block capacitor 655 may be connected to the differential input signal RFIN−.

It will be appreciated that the biasing resistors (or choke inductors) 656 and 657 may block the RF input signals (RFIN+, RFIN−) and feed the adaptive bias voltage output signal OUT from the adaptive bias circuit 651 through themselves. Moreover, the input DC block capacitors 654 and 655 may block the previous stage DC voltage, and the output DC block capacitors 661 and 662 may block the output DC voltage (e.g., from RFOUT− and RFOUT+)

Figure 7:
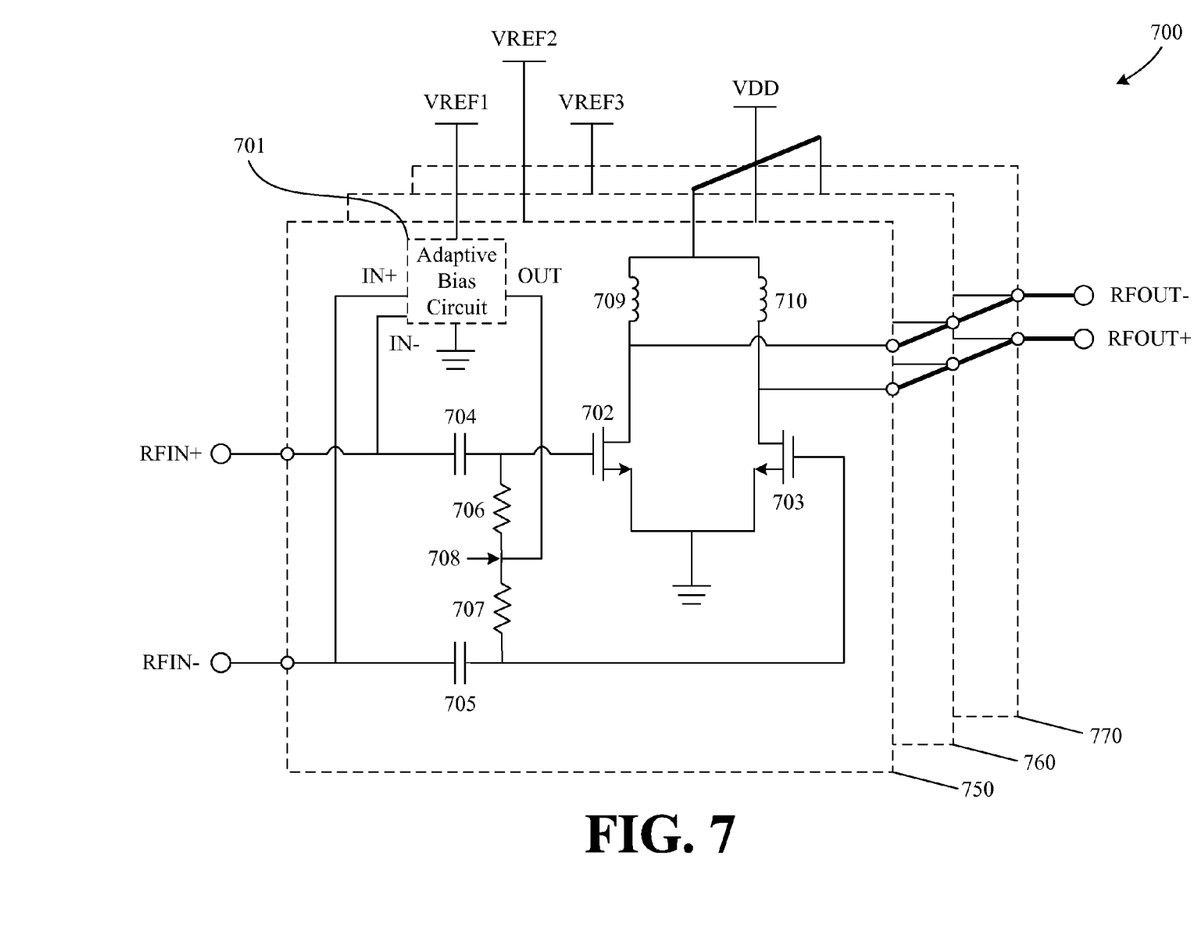
FIG. 7 illustrates an example of multiple parallel amplifiers with multiple adaptive bias circuits in accordance with an example embodiment of the invention.
Figure 8:
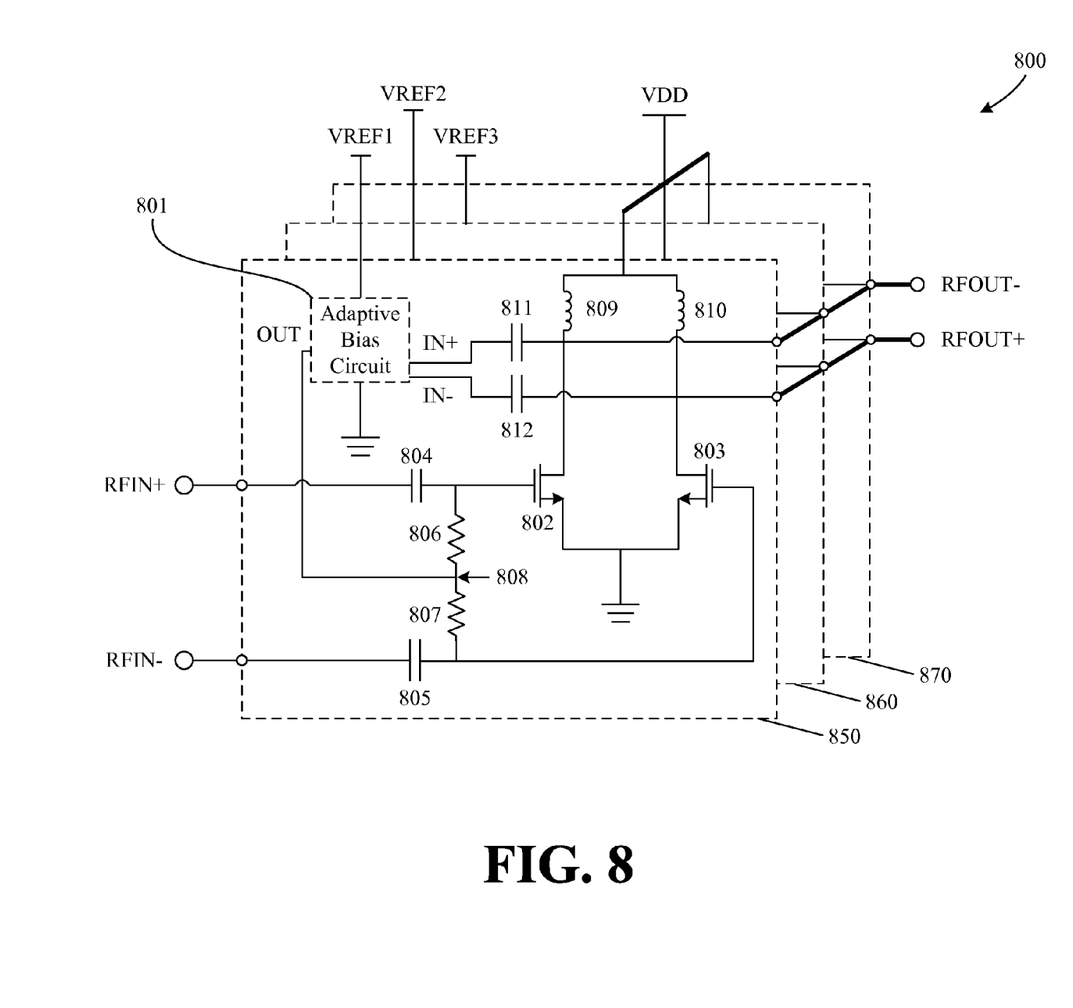
FIG. 8 illustrates another example of multiple parallel amplifiers with multiple adaptive bias circuits in accordance with an example embodiment of the invention.

FIGS. 7 and 8 generally illustrate example power amplification systems for utilizing multiple parallel power combined amplifiers with multiple adaptive bias circuits, where at least two of the adaptive bias circuit can have a different bias range. As will be described in further detail below, such systems may include a plurality of power amplifiers (e.g., differential amplifiers) configured in parallel, where the plurality of power amplifiers may receive at least one common input signal, where each of the plurality of power amplifiers may generate a respective at least one amplified output signal, and where respective at least one amplified output signal are combined to provide at least one combined amplified signal. The systems may further utilize a plurality of adaptive bias circuits corresponding to each of the plurality of power amplifiers for providing respective adaptive bias signals to the respective power amplifier, where at least two of the plurality of adaptive bias circuits may have differing bias ranges for the provided respective adaptive bias signals.

More specifically, FIG. 7 illustrates a schematic diagram of multiple differential amplifiers with multiple adaptive bias circuits, where reference voltages may be different from each other in accordance with an example embodiment of the invention. As shown in the example embodiment of FIG. 7, the example multiple parallel amplifiers with multiple adaptive bias circuits may include multiple parallel amplifier sections 750, 760, and 770. In an example embodiment of the invention, each multiple parallel amplifier may be identical or may have a similar structure to the other amplifiers but with different device sizes. It will also be appreciated that the configuration of each of parallel amplifier section 750, 760, 770 may be substantially similar to the configuration of the amplifier discussed with respect to FIG. 5, according to an example embodiment of the invention.

Still referring to the example embodiment shown in FIG. 7, an amplifier section 750 of the multiple parallel amplifier sections may include a differential amplifier including transistors 702 and 703, an adaptive bias circuit 701, biasing resistors or choke inductors 706 and 707, and input DC block capacitors 704 and 705. The differential amplifier that includes transistors 702 and 703 may amplify input differential signals RFIN+ and RFIN−. The adaptive bias circuit 701 may generate adaptive bias voltage for gates of transistors 702 and 703 of the differential amplifier according to reference voltage VREF1, as optionally provided using bonding wires 709, 710. The biasing resistors or choke inductors 706 and 707 may block the RF input signals and feed adaptive bias voltage through themselves. Moreover, input DC block capacitors 704 and 705 may block the adaptive bias circuit 701 input bias. In an example embodiment of the invention, the adaptive bias circuit 701 detects the input power RFIN+ and RFIN− in front of the input DC block capacitors 704 and 705 and feeds the generated adaptive bias at the virtual ground 708 of the differential amplifier inputs through the biasing resistors 706 and 707. In an example embodiment of the invention, the other amplifier sections 760 and 770 may include the same configuration as that of amplifier section 750 with different device sizes or different reference voltages. For instance, the reference voltages VREF1, VREF2, and VREF3 may not all necessarily be the same voltages, according to an example embodiment of the invention. Thus, each respective adaptive bias circuit 701 of parallel amplifiers sections 750, 760, 770 can have a different bias range for the adaptive bias output signal.

FIG. 8 illustrates another schematic diagram of multiple differential amplifiers with multiple adaptive bias circuits, where reference voltages may be different from each other in accordance with an example embodiment of the invention. As shown in the example embodiment of FIG. 8, the example multiple parallel amplifiers with multiple adaptive bias circuits may include multiple parallel amplifier sections 850, 860, and 870. In an example embodiment of the invention, each multiple parallel amplifier may be identical or may have a similar structure to the other amplifiers but with different device sizes. It will also be appreciated that the configuration of each of parallel amplifier sections 850, 860, 870 may be substantially similar to the configuration of the amplifier discussed with respect to FIG. 6, according to an example embodiment of the invention.

Still referring to the example embodiment shown in FIG. 8, an amplifier section 850 of the multiple parallel amplifier sections may include a differential amplifier including transistors 802 and 803, an adaptive bias circuit 801, biasing resistors or choke inductors 806 and 807, and input DC block capacitors 804, 805. The differential amplifier that includes transistors 802 and 803 may amplify input differential signals RFIN+ and RFIN−. The adaptive bias circuit 801 may generate adaptive bias voltage for gates of transistors 802 and 803 of the differential amplifier according to reference voltage VREF1. The biasing resistors or choke inductors 806 and 807 may block the RF input signals and feed adaptive bias voltage through themselves. Moreover, the input DC block capacitors 804 and 805 may block the previous stage DC voltage, and the output DC block capacitors 812 and 813 may block the output DC voltage. In an example embodiment of the invention, the adaptive bias circuit 801 detects the output power RFOUT+ and RFOUT− and feeds the generated adaptive bias at the virtual ground 808 of the differential amplifier inputs through biasing resistors 806 and 807. In an example embodiment of the invention, the other amplifiers 860 and 870 may include the same configuration with different device sizes or different reference voltages. For instance, the reference voltages VREF1, VREF2, and VREF3 may not necessarily all be the same values, according to an example embodiment of the invention. Thus, each respective adaptive bias circuit 801 of parallel amplifier section 850, 860, 870 can have a different bias range for the adaptive bias output signal.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplification system, comprising:
   a plurality of power amplifiers configured in parallel, wherein the plurality of power amplifiers receive at least one common input signal, wherein each of the plurality of power amplifiers generates a respective at least one amplified output signal, wherein the respective at least one amplified output signal of each of the plurality of power amplifiers is combined to provide at least one combined amplified signal; and
   a plurality of adaptive bias circuits corresponding to each of the plurality of power amplifiers for providing a respective adaptive bias signal to the respective power amplifier, wherein at least two of the plurality of adaptive bias circuits have differing bias ranges for the provided respective adaptive bias signals,
   wherein each of at least two of the plurality of adaptive bias circuits comprise:
      a differential amplifier that receives differential input signals and generates amplified differential input signals,
      a current mirror that converts the amplified differential input signals to generate a single-ended signal,
      a low-pass filter that filters out one or more high-frequency components of the single-ended signal to generate a filtered single-ended signal, and
      a common-source amplifier or common-emitter amplifier that receives the filtered single-ended signal and generates the respective adaptive bias signal for operating the respective power amplifier.

2. The power amplification system of claim 1, wherein the differential input signals are based upon either the at least one common input signal or the at least one amplified output signal generated by the respective power amplifier.

3. The power amplification system of claim 1, wherein one or more high-frequency components filtered out of the single-ended signal comprises a carrier signal, the carrier signal associated with the differential input signals.

4. The power amplification system of claim 1,
   wherein the differential amplifier comprises a first transistor having a first drain or collector and a second transistor having a second drain or collector,
   wherein the current mirror comprises a third transistor having a third drain or collector and a fourth transistor having a fourth drain or collector,
   wherein the first drain or collector is connected to the third drain or connector, and the second drain or collector is connected to the fourth drain or connector, to provide the amplified differential input signals from the differential amplifier to the current mirror.

5. The power amplification system of claim 4, wherein the third transistor further includes a third gate or base, wherein the fourth transistor further includes a fourth gate or base, wherein the third gate or base is connected to the fourth gate or base, and wherein the third gate or base is further connected to the third drain or collector such that the third transistor is a diode-connected transistor.

6. The power amplification system of claim 4,
   wherein the third transistor further includes a third source or emitter, wherein the fourth transistor further includes a fourth source or emitter, wherein the low-pass filter comprises a capacitor having a first end and a second end, wherein the common-source amplifier or common-emitter amplifier comprises a fifth transistor having a fifth gate or base, a fifth source or emitter, and a fifth drain or collector,
   wherein the third source or emitter, the fourth source or emitter, the first end of the capacitor, and the fourth source or emitter are connected together,
   wherein the fourth drain or collector, the second end of the capacitor, and the fifth gate or base are connected together, wherein the generated adaptive bias signal is provided at the fifth drain or collector.

7. The power amplification system of claim 1, wherein each of at least two of the plurality of adaptive bias circuits further comprise:
   a load having at least a resistor in parallel with a capacitor, the load connected to the common-source amplifier or common-emitter amplifier, wherein the load is operative to filter one or more high-frequency components of the generated adaptive bias signal.

8. The power amplification system of claim 1, wherein each of the plurality of power amplifiers comprises at least one field-effect transistor (FET) or bipolar junction transistor (BJT), wherein the respective adaptive bias signal is the adaptive voltage signal if received by a gate of the at least one FET of the power amplifier, and wherein the adaptive bias signal is the adaptive current signal if received by a base of the at least one BJT of the power amplifier.

9. The power amplification system of claim 1, wherein the respective adaptive bias signal comprises an adaptive voltage signal or an adaptive current signal.

\* \* \* \* \*